(12) United States Patent
Sakui

(10) Patent No.: US 6,329,250 B1
(45) Date of Patent: Dec. 11, 2001

(54) METHOD OF MANUFACTURING SEMICONDUCTOR MEMORY DEVICE

(75) Inventor: Koji Sakui, Tokyo-To (JP)

(73) Assignee: Kabushiki Kaisha Toshiba, Kanagawa-ken (JP)

( * ) Notice: Subject to any disclaimer, the term of this patent is extended or adjusted under 35 U.S.C. 154(b) by 0 days.

(21) Appl. No.: 09/521,612

(22) Filed: Mar. 9, 2000

(30) Foreign Application Priority Data

Mar. 11, 1999 (JP) .................................................. 11-064908

(51) Int. Cl.⁷ .................................................. H01L 21/8246
(52) U.S. Cl. ........................... 438/275; 438/276; 438/302
(58) Field of Search .................. 438/275–278, 438/302

(56) References Cited

U.S. PATENT DOCUMENTS

| | | | |
|---|---|---|---|
| 4,608,748 | * | 9/1986 | Noguchi et al. . |
| 5,470,774 | * | 11/1995 | Kunitou . |
| 5,592,012 | * | 1/1997 | Kubota .................................. 257/391 |
| 5,675,167 | * | 10/1997 | Yamane et al. ....................... 257/345 |
| 5,716,885 | * | 2/1998 | Kim et al. ............................. 438/275 |

FOREIGN PATENT DOCUMENTS 08-162544    6/1996   (JP) .

OTHER PUBLICATIONS

"Self-Aligned Control of Threshold Voltages in Sub-0.2-μm MOSFET's", H. Kurata, et al., IEEE Transactions on Electron Devices, vol. 45, No. 10, Oct. 1998, pp. 2161–2165.

* cited by examiner

*Primary Examiner*—Jey Tsai
(74) *Attorney, Agent, or Firm*—Banner & Witcoff, LTD.

(57) ABSTRACT

A semiconductor memory device has a semiconductor substrate and a plurality of memory transistors, each having a gate electrode, a source diffused layer and a drain diffused layer and provided in array. Data is fixedly written as a difference between threshold voltages depending on an existence or non-existence of a doped channel layer. The doped channel layer extends to at least one of the source and the drain diffused layers. In order to manufacture such memory device, after forming a plurality of memory transistors, the steps of providing a mask having an opening formed so that a side surface of the gate electrode and substrate surface of one of the source diffused layer and the drain diffused layer are exposed and providing a doped channel layer under the gate electrode and in one of the source and drain diffused layers by implanting impurity ions through the opening with an inclined angle selected from a range from perpendicularity to parallelism to the substrate.

9 Claims, 18 Drawing Sheets

Y–Y' SECTION

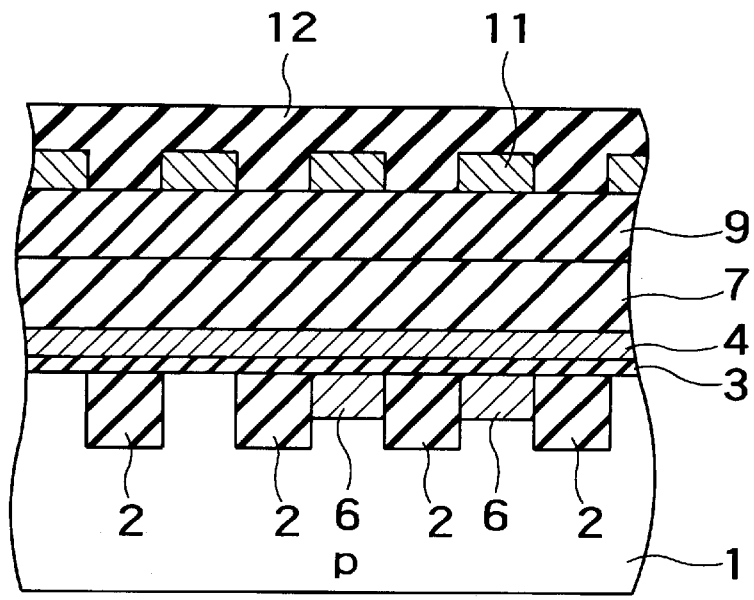
FIG. 2A X-X' SECTION
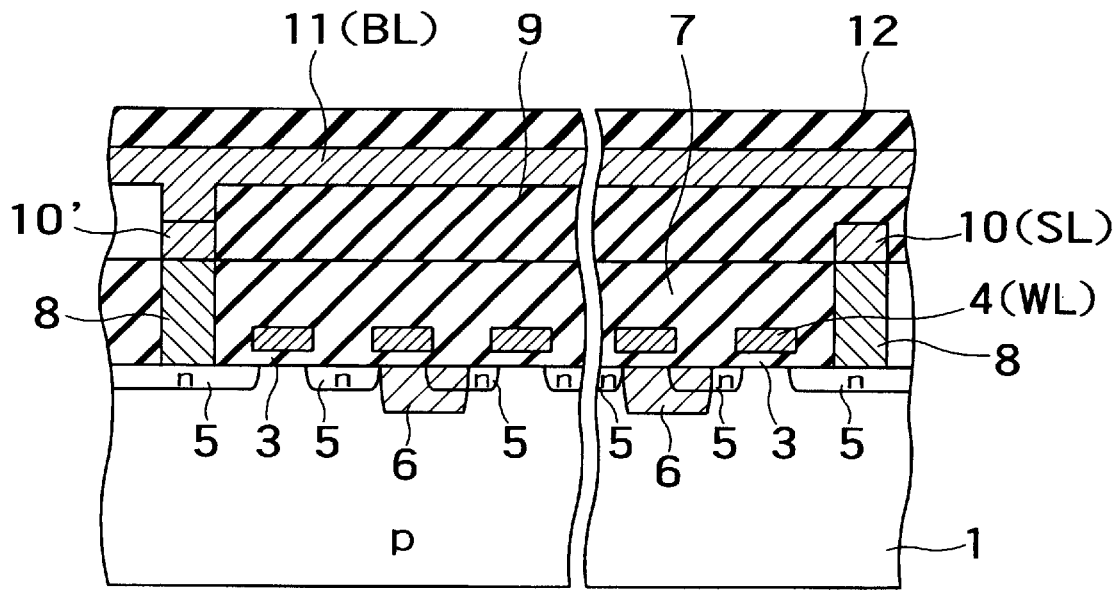
FIG. 2B Y-Y' SECTION

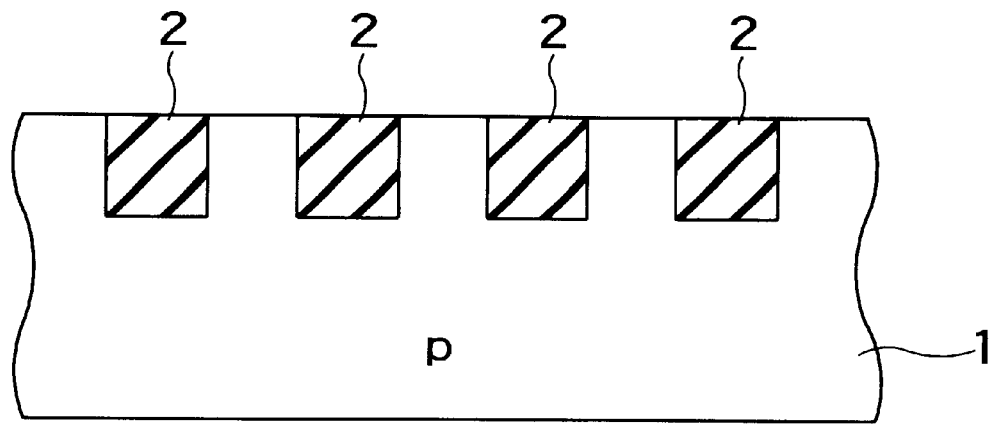
FIG. 4A  X-X' SECTION
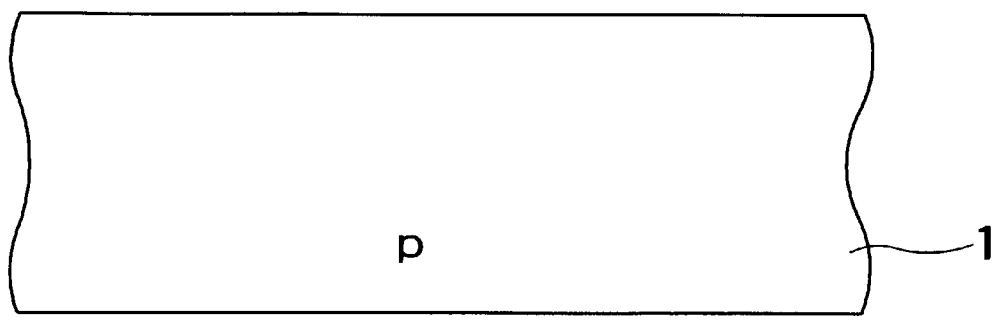
FIG. 4B  Y-Y' SECTION

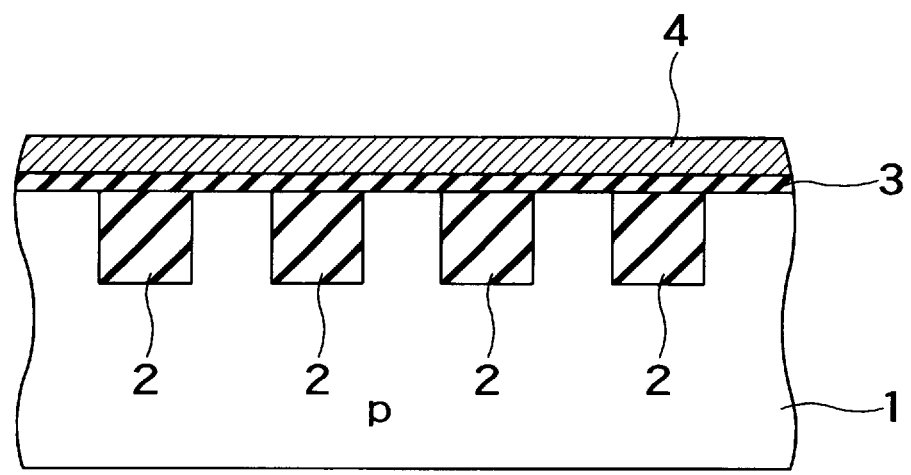
FIG. 5A X-X' SECTION
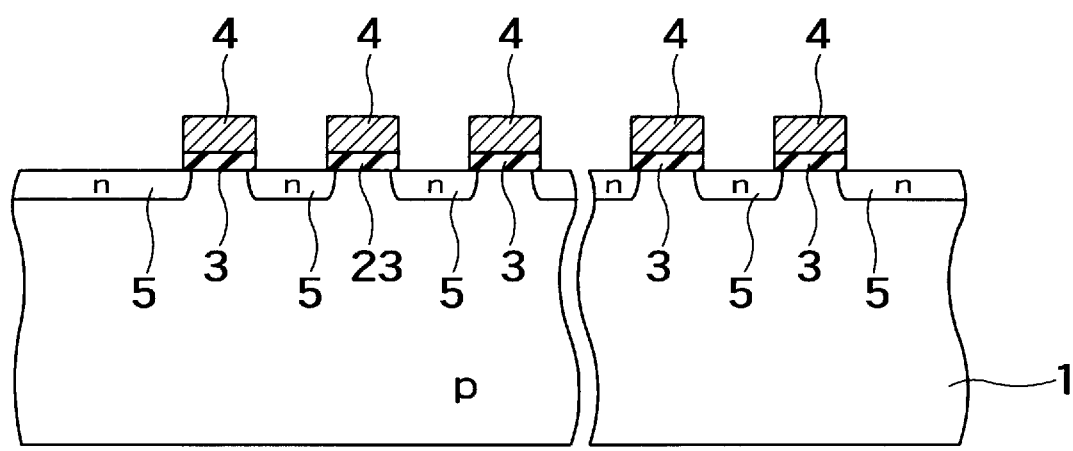
FIG. 5B Y-Y' SECTION

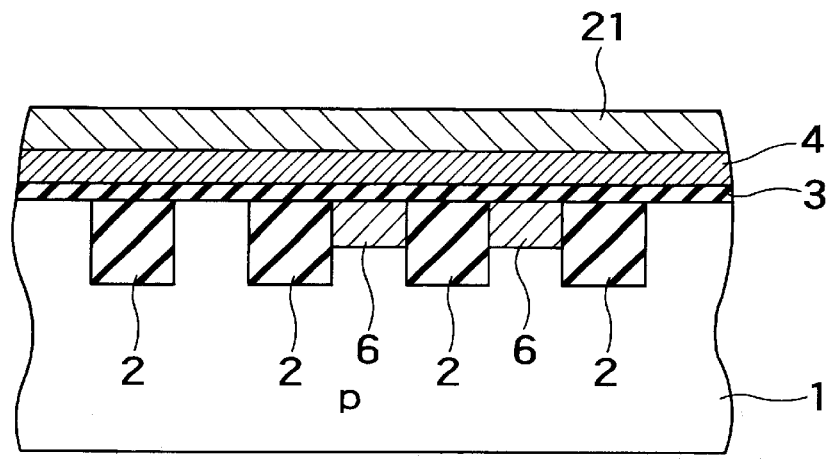
FIG. 6A X-X' SECTION
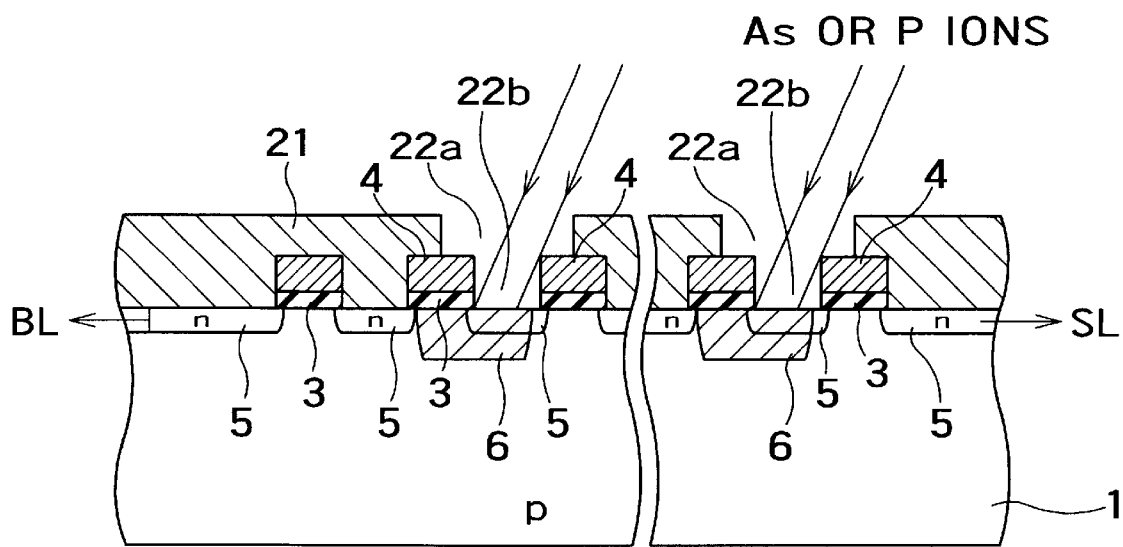
FIG. 6B Y-Y' SECTION

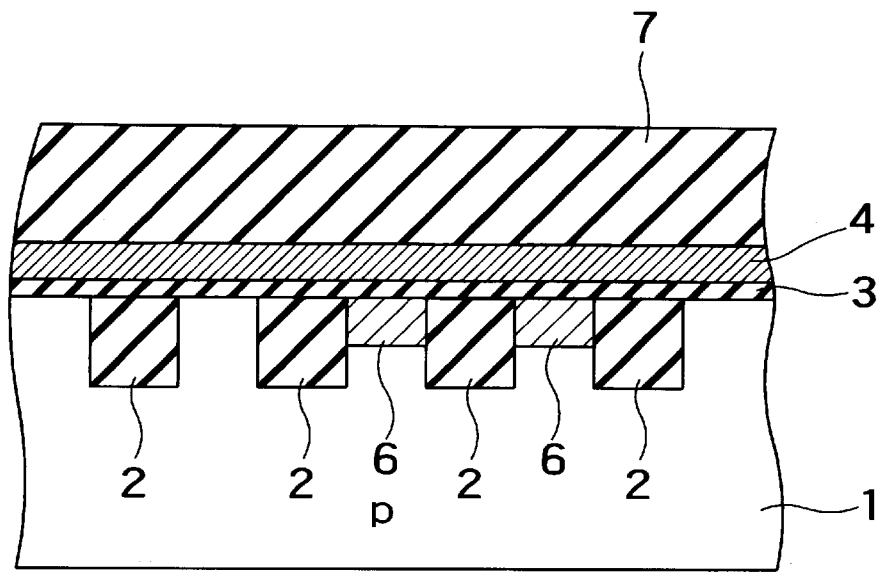
FIG. 7A  X-X' SECTION
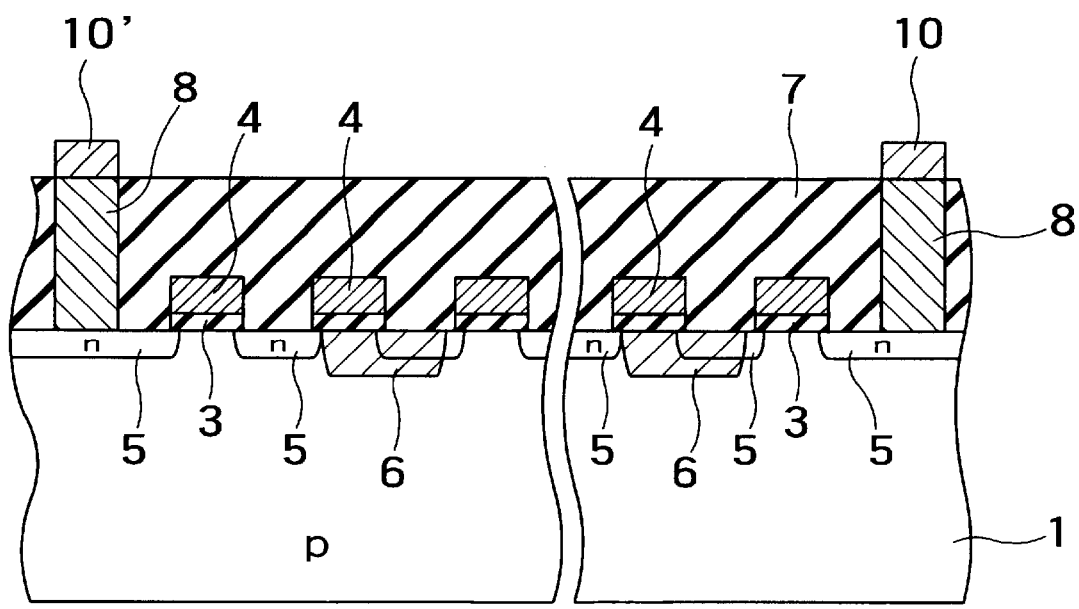
FIG. 7B  Y-Y' SECTION

METHOD OF MANUFACTURING SEMICONDUCTOR MEMORY DEVICE

BACKGROUND OF THE INVENTION

The present invention relates generally to a semiconductor memory device, and more particularly to a mask ROM including a memory transistor to which data is fixedly written as a difference between threshold voltages depending on an existence and non-existence of a doped channel layer.

A mask ROM in which data are fixedly stored by mask programing has hitherto been known as a read-only semiconductor memory. The mask ROM may be functionally structured so that an indication of whether or not the memory transistor is disposed at an intersection between a bit line and a word line is set corresponding to data "1" or "0". A diffused layer program mode shown in FIG. 19 and a contact program mode shown in FIG. 20 have been used as a programing mode of the mask ROM having a comparatively small memory capacity.

A mask ROM in which data are fixedly stored by mask programming has hitherto been known as a read-only semiconductor memory. The mask ROM may be functionally structured so that an indication of whether or not the memory transistor is disposed at an intersection between a bit line and a word line is set corresponding to data "1" or "0". A diffused layer program mode shown in FIG. 19 and a contact program mode shown in FIG. 20 have been used as a programing mode of the mask ROM having a comparatively small memory capacity.

Referring to FIGS. 19 and 20, a region indicated by hatching is a device isolation region, and a memory transistor MC corresponds to an intersection between a word line WL and a bit line BL. According to the diffused layer program mode in FIG. 19, the data is written depending on whether a diffused layer is formed at the area of the memory transistor which is surrounded by a broken line. According to the contact program mode in FIG. 20, the data is written depending on whether or not a bit line contact of the memory transistor MC surrounded by a broken line is formed. Both cases take a NOR type cell structure in terms of an equivalent circuit as shown in FIG. 21.

In the diffused layer program mode, though capable of enhancing integration, the diffused layer is formed at an initial stage of a process of manufacturing the memory, and hence a TAT (Turn Around Time) elongates. The contact program mode, because of being a program after forming the device, has a shorter TAT than in the diffused layer program mode but less integration.

By contrast, a NAND type cell shown in FIGS. 22 and 23 is used as the mask ROM capable of enhancing the integration. A region indicated by hatching in FIG. 22 is a device isolation region, wherein the memory transistors are connected in series to the bit line. The programming is executed depending on whether channel ion implantation is performed beforehand into a memory transistor MC region defined by a broken line. For example, the memory transistor formed with a doped channel layer is categorized as a depletion (D) type, the memory transistors other than the D-type are classified as an enhancement (E) type. It follows, as shown in FIG. 23, that the data is written as a distribution of the E- and D-types.

A cell structure of the large-capacity mask ROM includes a contactless type cell shown in FIG. 24 in addition to the NAND type cell. The contactless type cell is obtained by providing n$^+$ type diffused layers in strips on the semiconductor substrate, thereafter providing a gate oxide layer over the entire surface, and pattern-forming word lines WL thereon by using polysilicon layers. Three strips of adjacent n$^+$ type diffused layers become, as illustrated in FIG. 24, a bit line BL and ground lines VSS0, VSS1 between which the bit line BL is interposed. All the regions just under the word lines interposed between the n$^+$ type diffused layers serve as channel regions of the memory transistors. The data is written depending on whether ion implantation into the channel region of one single memory transistor indicated by the broken line is performed or not.

There were, however, limits to the high integrations of the mask ROMs of the NAND type cell and of the contactless type cell. A major factor therefor is that the channel ion implantation of the memory transistor might involve a deviation in mask alignment, and hence a design rule for the channel ion implantation must have some allowance. Therefore, if the memory transistor is downsized, a lower limit of a memory cell size is resultantly specified by the design rule for the channel ion implantation, and a further downsized structure is hard to obtain.

SUMMARY OF THE INVENTION

It is a primary object of the present invention to provide a semiconductor memory device for executing programming by a channel ion implantation and a manufacturing method thereof, which are capable of reducing a cell size by making a doped channel layer of a memory transistor self-aligned with a gate electrode.

According to one aspect of the present invention, there is provided a semiconductor memory device comprising:

a semiconductor substrate;

a plurality of memory transistors for storing fixed data, each having a gate electrode, a source diffused layer and a drain diffused layer, provided in an array on said semiconductor substrate;

wherein the fixed data of a memory transistor is determined by existence or non-existence of a doped channel layer under the gate electrode, and the doped channel layer extends to at least one of the source and the drain diffused layers so that the doped channel layer overlaps with at least one of the source and the drain diffused layers.

In this semiconductor memory device, the doped channel layer is formed deeper than the source/drain diffused layers so as to be overlapped by one of the source/drain diffused layers and not to be overlapped with the other diffused layer. A punch-through phenomenon between the source/drain diffused layers can be thereby surely prevented.

According to another aspect of the present invention, there is provided a method of manufacturing a semiconductor memory device comprising the steps of:

forming a plurality of memory transistors, each having a gate electrode on a semiconductor substrate, each of said transistors having a source diffused layer and a drain diffused layer;

providing a mask having an opening formed so that a side surface of the gate electrode and substrate surface of one of the source diffused layer and the drain diffused layer are exposed; and providing a doped channel layer under the gate electrode and in one of the source and drain diffused layers by implanting impurity ions through said opening with an inclined angle selected from a range from perpendicularity to parallelism to said semiconductor substrate.

According to the present invention, there are a case (a) where the memory transistor is classified as a first conductivity type MOS transistor, and the doped channel layer is categorized as a second conductivity type impurity layer, and a case (b) where the memory transistor is classified as the first conductivity type MOS transistor, and the doped channel layer is categorized as a first conductivity type impurity layer. In the case (a), the memory transistor formed with the doped channel layer has a higher threshold value than in the memory transistor in an initial state. To be specific, for instance, the memory transistor in the initial state is, it is assumed, of a D-type, and the memory transistor provided with the doped channel layer is set into an E-type. In the case (b), the threshold value of the memory transistor provided with the doped channel layer becomes lower than in the memory transistor in the initial state. Specifically, for example, it is assumed that the memory transistor in the initial state is of the E-type, and the memory transistor provided with the doped channel layer is set into the D-type.

According to the present invention, the ion implantation for forming the doped channel layer with an inclined angle may be effected either from the side of a source diffused layer or from the side of a drain diffused layer. In the case (a), however, it is preferable that the doped channel layer be formed by the ion implantation through an opening formed so that a side surface of the gate electrode and substrate surface of the drain diffused layer is exposed. This is because if the ion is implanted to form the side of the source diffused layer, it becomes counter doping of an opposite conductivity type impurity with respect to the source diffused layer, and a source resistance is increased, which might lead to deterioration of a reading performance. Whereas in the case (b), it is preferable in terms of reducing the source resistance that the ion implantation with angle is carried out from the side of the source diffused layer.

Alternatively, the doped channel layer can be formed by implanting the ion with an inclined angle twice from the side of the drain diffused layer as well as from the side of the source diffused layer.

Based on the manufacturing method according to the present invention, to be specific, the gate electrodes of the memory transistors are formed in a pattern as consecutive word lines in one direction, and the ion implantation mask is so provided between the adjacent word lines as to be self-aligned with the word lines.

In this case, a step of providing the ion implantation mask may include as a mode (1) a step of stacking a mask material layer, and a step of selectively forming an opening in the mask material layer between the adjacent word lines. Alternatively, the above mask providing step may include as a mode (2) a step of embedding the mask material layer in between the adjacent word lines, and a step of selectively forming an opening in the mask material layer embedded in the previous step.

According to the present invention, an inclined angle θ of the ion implantation to the perpendicular line to the semiconductor substrate is set to satisfy a relationship of tan θ<S/H where S is the space between said adjacent word lines, and H is the height of the opening.

Further, according to the present invention, specifically, the plurality of memory transistors, of which the gate electrodes are consecutively formed in pattern in one direction and thus become word lines, are assembled as a memory cell structure of any one of a NAND type cell, an AND type cell and a NOR type cell.

According to the present invention, the doped channel layer of the memory transistor based on the mask programming is provided by the ion implantation with an inclined angle in self-alignment with the gate electrode, and hence there is no necessity for an alignment allowance for the ion implantation. Accordingly, the high-integrated mask ROM with a reduced unit cell area is obtained.

What the present invention is effective in embraces a case of using the miniaturized memory transistor having a channel length (gate width) of 0.2μm or under. In the case of the hyperfine transistor described above, a technique of controlling a threshold value in self-alignment by the ion implantation with an inclined angle with the gate electrode serving as a mask, has recently been proposed (IEEE TRANSACTIONS ON ELECTRON DEVICES, VOL.45, NO. 10, OCTOBER 1998, PP.2161–2165).

BRIEF DESCRIPTION OF THE DRAWINGS

FIGS. 2A and 2B are sectional views taken along the lines X–X' and Y–Y' in FIG. 1;

FIGS. 4A and 4B are sectional views showing a device separating process in the embodiment 1;

FIGS. 5A and 5B are sectional views showing a process of forming a memory transistor in the embodiment 1;

FIGS. 6A and 6B are sectional views showing a mask programming process in the embodiment 1;

FIGS. 7A and 7B are sectional views showing a source line forming process in the embodiment 1;

DESCRIPTION OF THE PREFERRED EMBODIMENTS

Embodiments of the present invention will hereinafter be described with reference to the accompanying drawings.

First Embodiment

Figure 1:
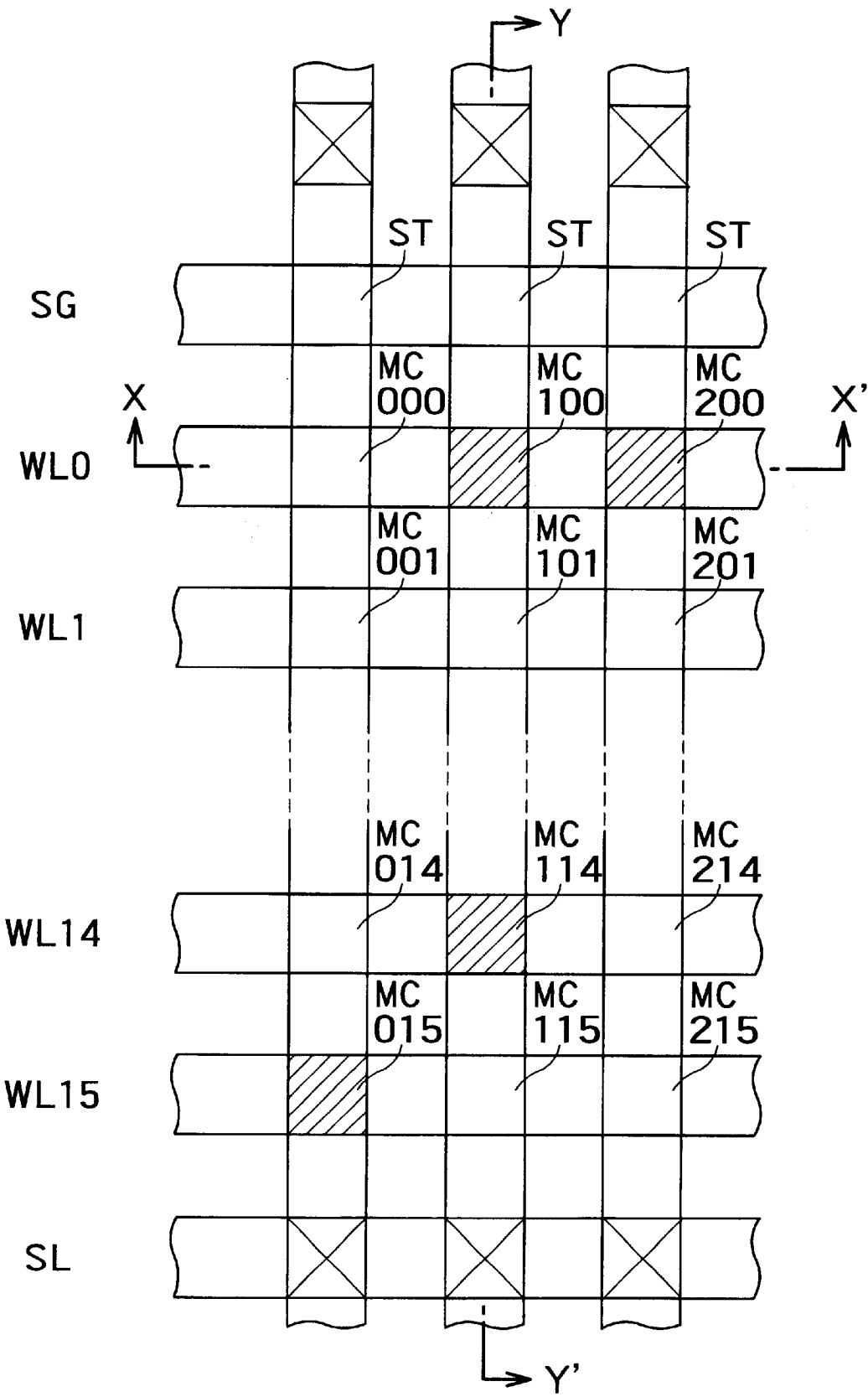
FIG. 1 is a view showing a layout of a mask ROM in an embodiment 1 of the present invention.
Figure 3:
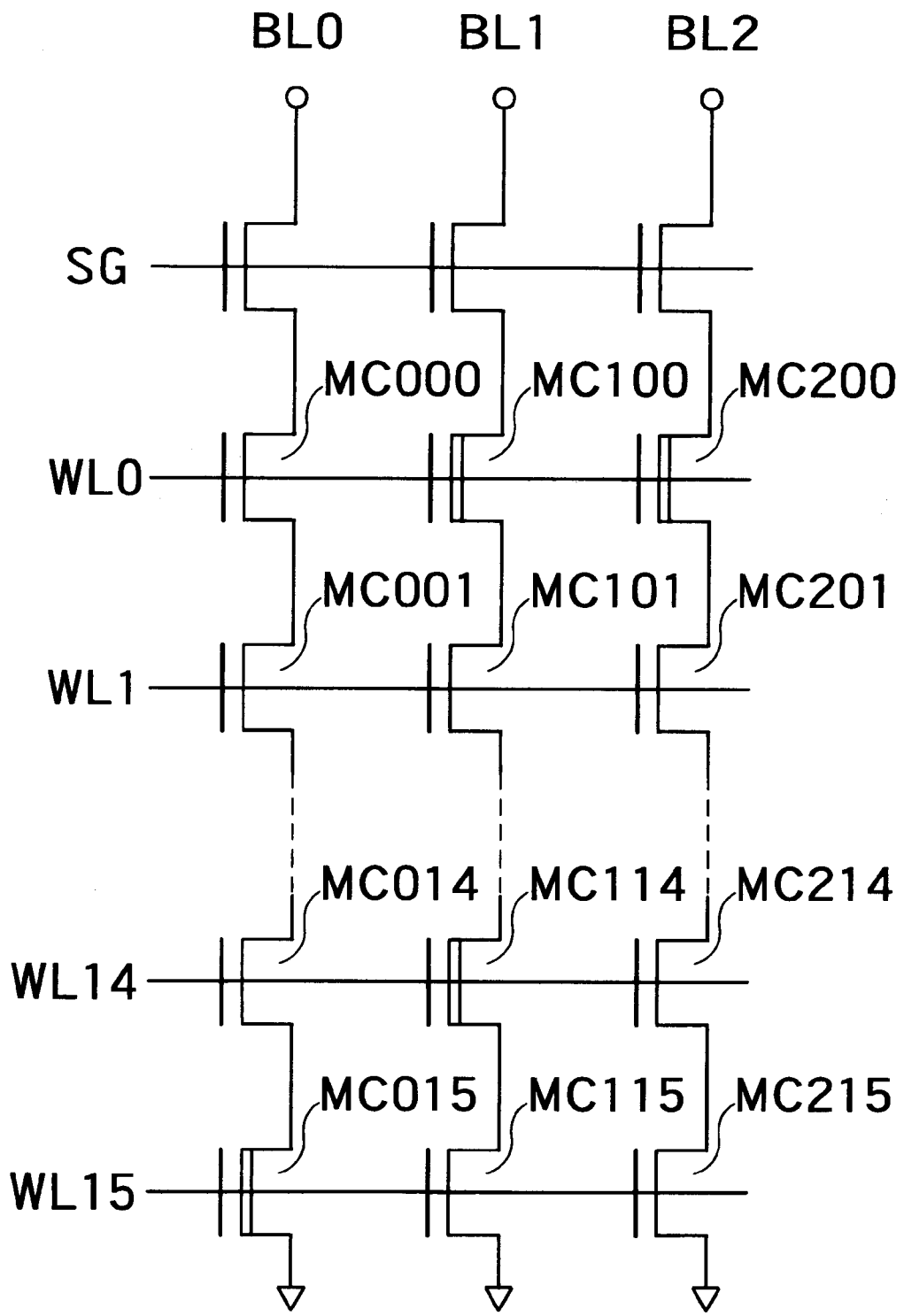
FIG. 3 is a view showing an equivalent circuit of the mask ROM in the embodiment 1.

FIG. 1 is a plan view showing a NAND type mask ROM in a first embodiment of the present invention. FIGS. 2A and 2B are sectional views respectively taken along the lines X–X' and Y–Y' in FIG. 1. FIG. 3 is a view showing an equivalent circuit.

A memory transistor MC is classified as an n-type MOS transistor, in which a p-type silicon substrate 1 (or a p-type well) is provided with a gate electrode 4 via a gate insulating layer 3, and the gate electrode 4 is provided in self-alignment with an n-type diffused layer 5 serving as a source and a drain. The gate electrodes 4 are consecutively provided in one single direction in a pattern and thus serve as word lines WL. The word lines WL are arrayed at a line-space ratio of, e.g., 0.2 $\mu$m/0.2 $\mu$m. Sixteen pieces of memory transistors MC are connected in series in such a form that the transistors MC adjacent to each other share the source and drain, thereby configuring a NAND type cell. One terminal of the NAND type cell is connected to a bit line BL, and the other terminal thereof is connected to a source line SL.

A selective gate transistor ST constructed in the same way as the memory transistor is provided at the connecting point of the NAND type cell to the bit line BL, gate electrodes of the selective gate transistors ST are likewise consecutively provided in one direction as in the case of the word lines WL and thus serve as selective gate lines SG.

The memory transistor MC is categorized as an E-type in an initial state in the first embodiment. Among those memory transistors MC, the memory transistors MC015, MC100, MC114, MC200 indicated by hatching in FIG. 1 are, as shown in FIG. 2B, provided with n-type doped channel layers 6 by mask programing, resulting in a D-type. The mask program is, as will hereinafter be explained, carried out by utilizing an ion implantation with an inclined angle using an ion implantation mask having such an opening that an edge of the gate electrode 4 (i.e., the word line WL) serves as an opening edge.

A process of manufacturing the mask ROM in the first embodiment will be explained with reference to FIGS. 4A and 4B through 7A and 7B. FIGS. 4A and 4B through 7A and 7B are sectional views showing the manufacturing process, which correspond to the sectional views in FIGS. 2A and 2B.

As illustrated in FIG. 4, a P-type silicon substrate 1 is, to begin with, provided with device isolation insulating layers 2 so as to define device forming regions in stripes. The device isolation insulating layers 2 are formed by an STI (Shallow Trench Isolation) technique by which trenches are formed and the insulating layers are embedded therein in the first embodiment.

Next, as shown in FIG. 5, gate oxide layers 3 of approximately 10 nm are formed, and gate electrodes 4 are provided in pattern as word lines WL consecutively extending in one direction. Subsequently, n-type diffused layers 5 self-aligned with the word lines WL provided in pattern are formed by implanting the ion such as phosphorus or arsenic.

Note that the gate electrode 4 may involve the use of a polycrystalline silicon layer, a silicide layer, a polycide layer and a metal layer, etc.. Further, when the ion is implanted into the n-type diffused layer 5, the doping into the gate electrode 4 may be prevented in a state where the gate electrode is covered beforehand with a mask. Moreover, if a threshold voltage of the memory transistor to be manufactured becomes negative, the ion, i.e., boron in this case, is implanted previously into the entire surface of the substrate before patterning of the gate electrode, thus making an arrangement to obtain an E-type with a threshold voltage being positive. This may be set as an initial state.

The mask programming is executed at a stage where the word lines WL are formed in a pattern in the way described above. More specifically, as shown in FIG. 6, a mask material layer 21, which is to become an ion implantation mask, is provided and subjected to the patterning to form an opening 22a. The openings 22a are, as illustrated in FIG. 8, formed extending over the gate electrodes 4 adjacent to each other on the n-type diffused layer 5 disposed on the side of source diffused layers of the memory transistors MC015, MC100, MC114, MC200 where the channel ion implantations should be effected, viz., on the opposite side to the bit lines BL.

In this case, if the mask material layer 21 is etched by such a method that the gate electrode 4 serves as an etching stopper, a substantial opening 22b self-aligned with the gate electrode 4 (i.e., the edge of the gate electrode 4 serves as an opening edge) within the opening 22a of the mask material layer 21. Note that the mask material layer 21 may also be a resist.

Figure 8:
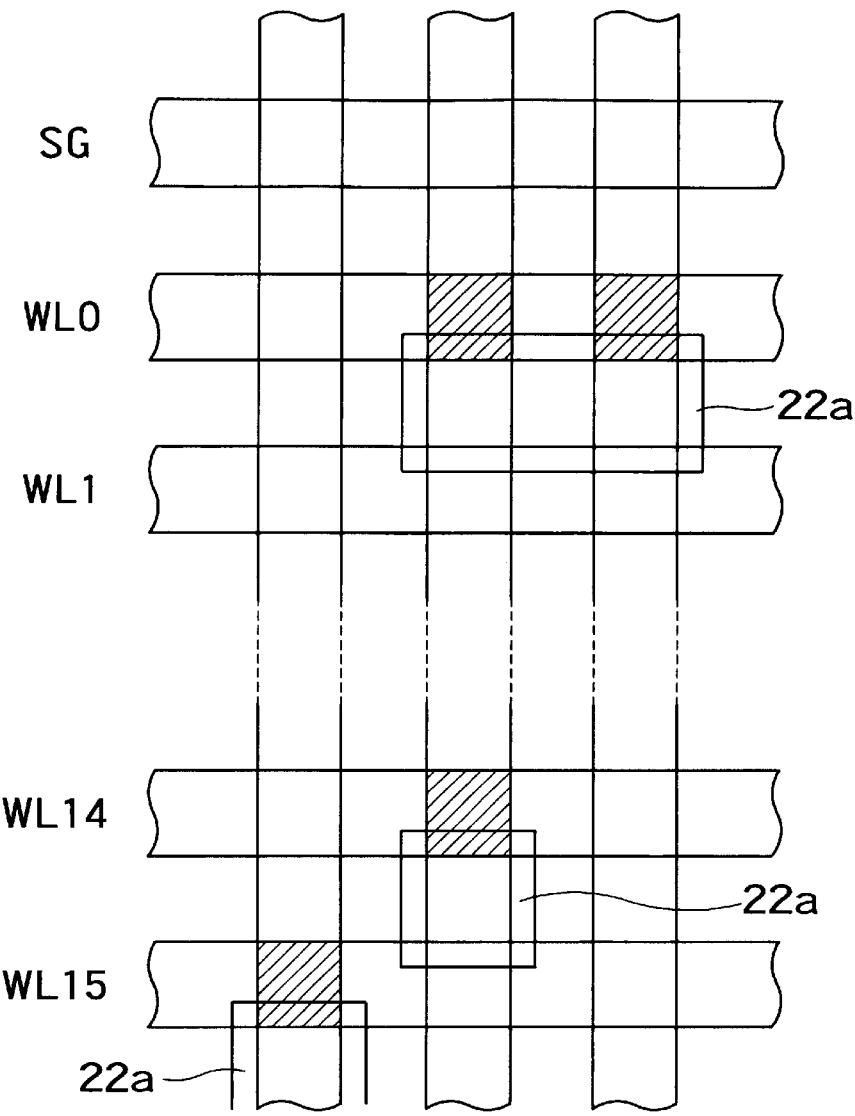
FIG. 8 is a plan view showing a state of how an ion implantation mask is provided in the embodiment 1.

In the example in FIG. 8, the openings 22a for the two memory transistors MC100, MC200 adjacent to each other in the word line direction are consecutively formed into one single opening.

Then, as shown in FIG. 6, the ion, i.e., phosphorus or arsenic, is implanted via the formed opening 22 in a direction inclined at an angle $\theta$ to the perpendicular line to the substrate 1, thereby forming an n-type doped channel layer 6. There memory transistors MC015, MC100, MC114, MC200 thereby come under a D-type where the threshold voltage is negative.

Figure 9:
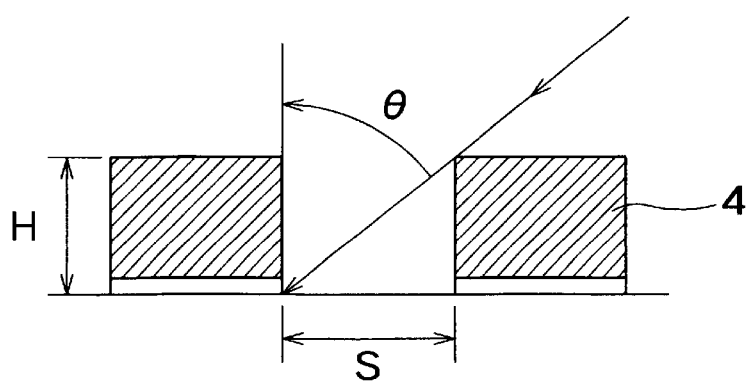
FIG. 9 is an explanatory view showing an inclined angle at which the ion is implanted with an angle in the embodiment 1.

The inclined angle $\theta$ of the ion implantation with an inclined angle is, as illustrated in FIG. 9, required to satisfy tan $\theta$<S/H, where H is the height of the opening, and S is the space between the gate electrodes 4. The height H of the opening is approximately equal to a thickness of the gate electrode 4 and is strictly, if the opening 22a of the mask material layer 21 is almost equal to the space between the gate electrodes 4, a total of the thickness of the gate electrode 4 and a thickness of the mask material layer 21. The ion implantation with an inclined angle is carried out for meeting this condition, and, in the case of a hyperfine memory transistor of which the gate electrode 4 is under 0.2 $\mu$m in width, it is thereby feasible to provide the doped channel layer 6 capable of controlling a threshold value thereof.

Thereafter, the mask material layer 21 is removed, and, as shown in FIG. 7, an inter-layer insulating film 7 is deposited. The inter-layer insulating film 7 is formed with contact holes for connections to the bit line BL and the source line SL, and plug electrodes 8 are embedded in those holes. The plug electrode 8 involves the use of materials such as aluminum, polycrystalline silicon, and tungsten. Then, source lines (SL) 10 for connecting the plug electrodes 8 are formed in pattern. In accordance with the first embodiment, the plug electrode 8 for connecting the bit line is also provided with a relay electrode 10" pattern-formed of the same material layer as that of the source line 10. The source line 10 and the relay electrode 10" use tungsten and aluminum.

Subsequently, as shown in FIG. 2, the inter-layer insulating film 9 is again deposited and formed with contact holes, and bit lines (BL) 11 are formed in pattern. The bit line 11 involves preferably the use of aluminum, and finally a protection layer 12 is provided.

Figure 10:
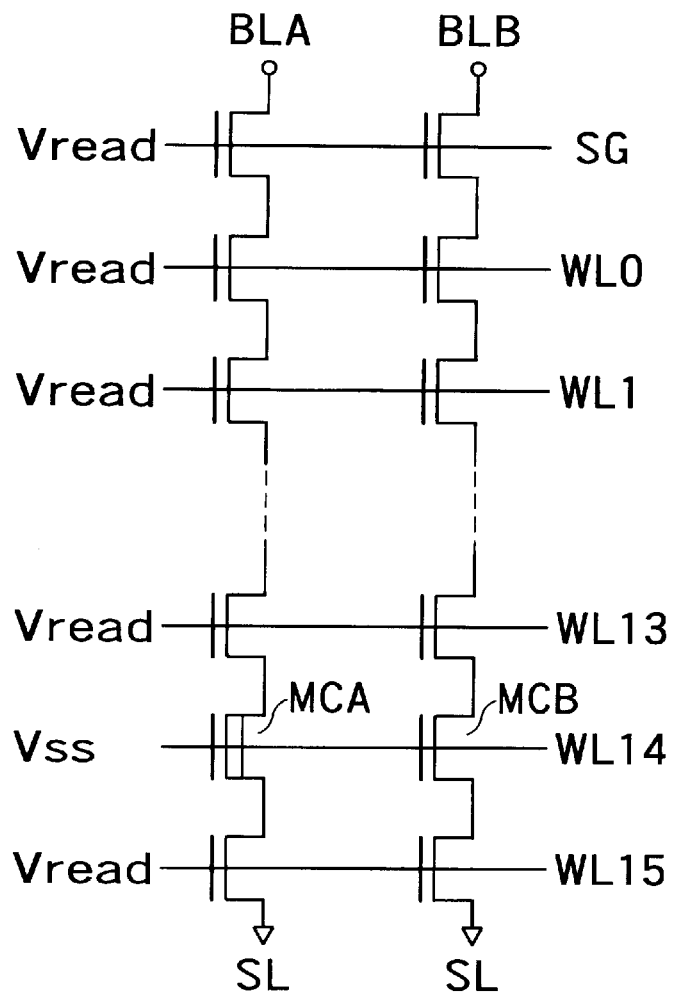
FIG. 10 is an explanatory view showing a reading process from a mask ROM in the embodiment 1.
Figure 11:
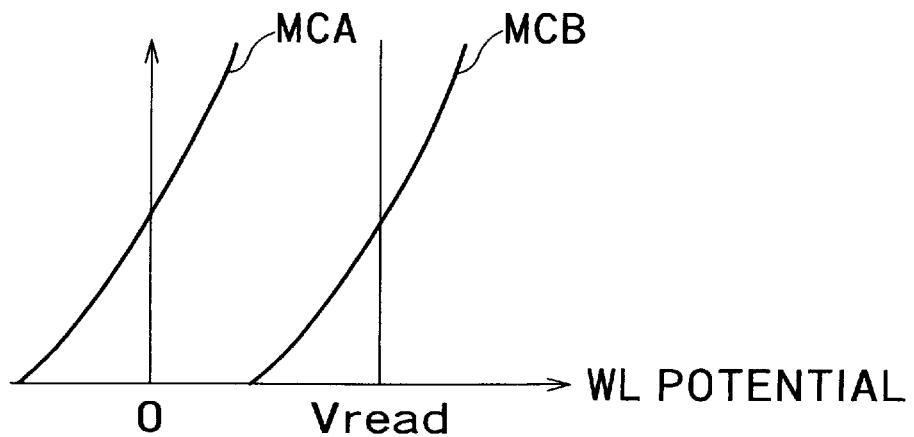
FIG. 11 is a graphic chart showing characteristics of memory transistors in the embodiment 1.

A reading operation from the mask ROM in the first embodiment will be explained with reference to FIGS. 10 and 11. Two pieces of memory transistors MCA, MCB connected to a word line WL14 are focused. The memory transistor MCA is of a D-type due to the writing, which implies that data is, e.g., "1". The memory transistor MCB is of an E-type, which implies that data is, e.g., "0". Vg-Id characteristics thereof are given as shown in FIG. 11.

It is assumed that bit lines BLA, BLB be previously charged at VBL (=3V) or biased. VSS (=0V) is given to the selective word line WL14 in this state, and other word lines WL0~WL13, WL15 and a selective gate line SG are given an intermediate voltage Vread (=3V) higher than the threshold voltage of the E-type memory transistor. In this case, all the memory transistors and selective gate transistors are switched ON at the side of the memory transistor MCA, with the result that the electric current flows from the bit line BLA to the source line SL. While on the other side of the memory transistor MCB, the memory transistor MCB is switched OFF, and hence no current flows to the bit line BLB. A sense amplifier detects whether the current flows or not, whereby whether the data is "0" or "1" can be judged.

In the first embodiment, the doped channel layer 6 is formed deeper than the n-type diffused layer 5 in a state of being overlapped with one n-type diffused layer 5 but not being overlapped with the other n-type diffused layer 5 serving as a source/drain diffused layer of the memory transistor. Accordingly, a punch-through between the source/drain diffused layers is prevented.

Second embodiment

According to the first embodiment discussed above, the n-type MOS transistor categorized as the E-type in the initial state is constructed as the memory transistor and selectively structured as the D-type by mask programming. If the memory transistor is classified as the n-type MOS transistor coming under the D-type in the initial state, based on the mask programming, the ion, i.e., the P-type impurity, is implanted into the channel, thus selectively setting it in a state where the threshold voltage is high (preferably in an E-type state). It is the same as the first embodiment that the mask programming is implemented by the ion implantation with an inclined angel from a side of the gate electrode.

Figure 12:
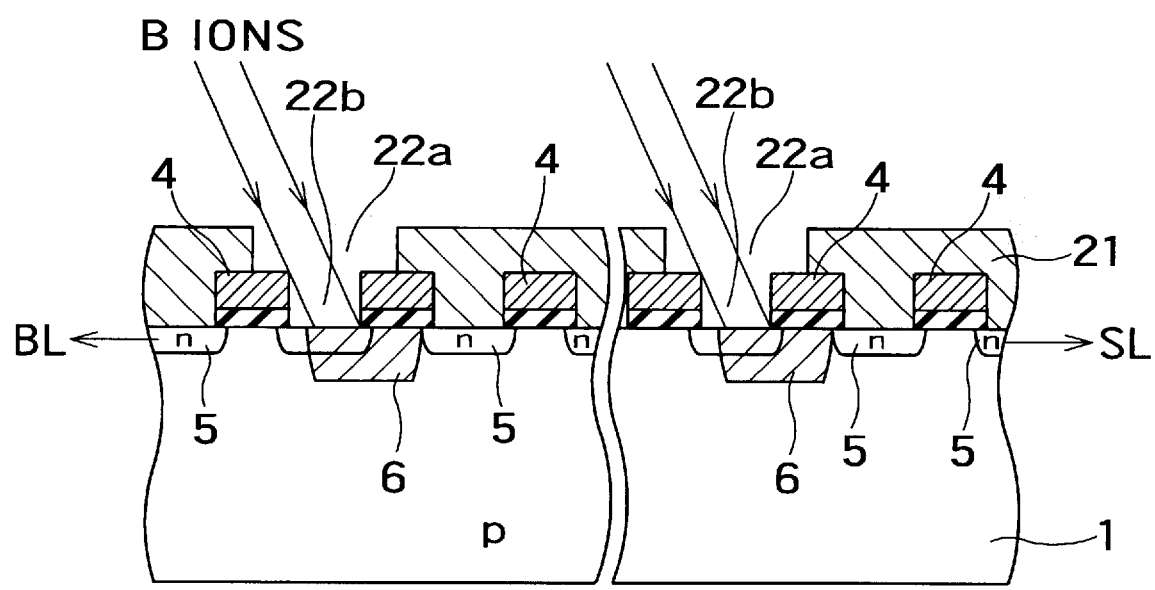
FIG. 12 is a sectional view showing a mask programming process of the mask ROM in a second embodiment.

In the first embodiment, however, the ion implantation with an inclined angle is effected from the side of the source diffused layer of the focused memory transistor. By contrast, according to the second embodiment, the ion implantation is implemented from the side of the drain 4 diffused layer. FIG. 12 shows a process of implanting the ion, corresponding to the way shown in FIG. 6B in the preceding first embodiment. The mask material layer 21 is formed with the opening 22a in the n-type diffused layer on the drain side (viz., on the side of the bit line BL) of the focused memory transistor. Then, the boron is implanted with an angle, thereby forming the doped channel layer 6. In this case, the doped channel layer 6 is of the P-type, and the memory transistor provided with the doped channel layer 6 is classified as the E-type with the threshold voltage being positive.

As in the second embodiment, if the memory transistor assuming the D-type in the initial state is structured as the E-type by the ion implantation with an inclined angle, the reason why the mask opening for the ion implantation is formed on the side of the drain diffused layer is that if the ion is implanted with an angle from the side of the source diffused layer, the P-type impurity is doped also into the n-type source diffused layer, resulting in an increase in source resistance. The increase in the source resistance of the memory transistor light lead to a rise in negative feedback function when the current flows and also to deterioration of a reading performance from the memory transistor. In accordance with the second embodiment, it is possible to prevent the above increase in the source resistance.

Third embodiment

Figure 13A:
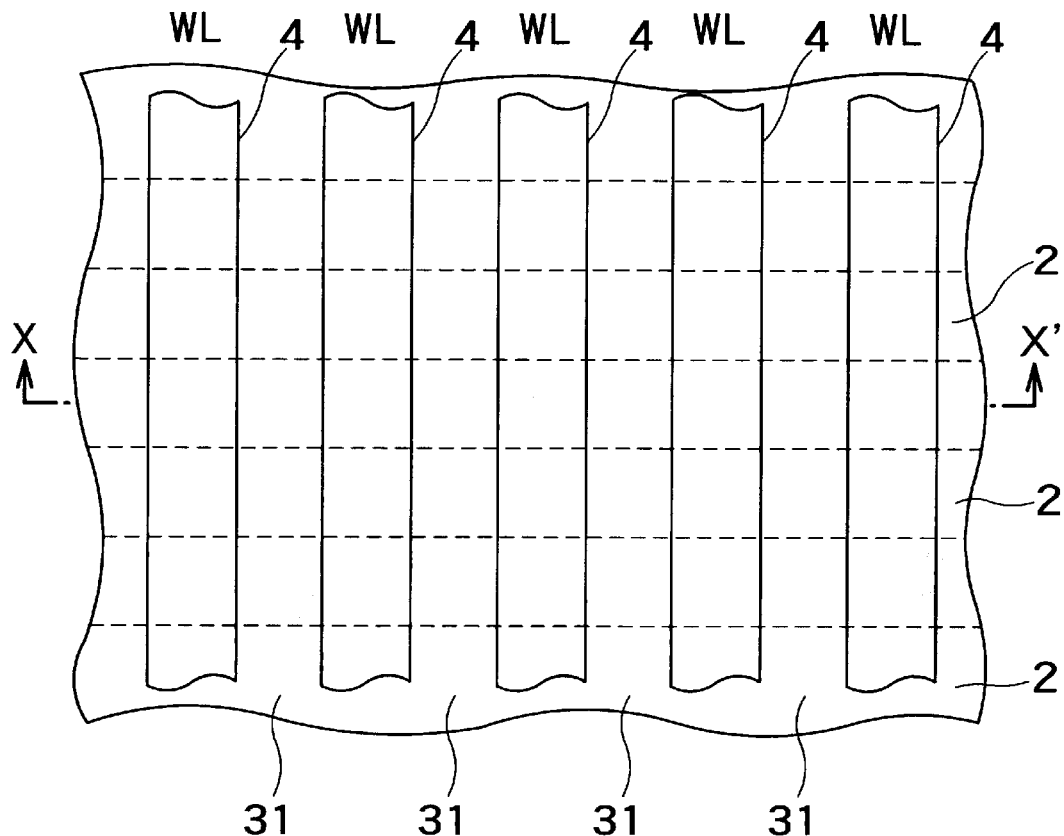
FIGS. 13A and 13B are a plan view and a sectional view showing a state of how a mask material layer of the mask ROM is formed in a third embodiment of the present invention.
Figure 13B:
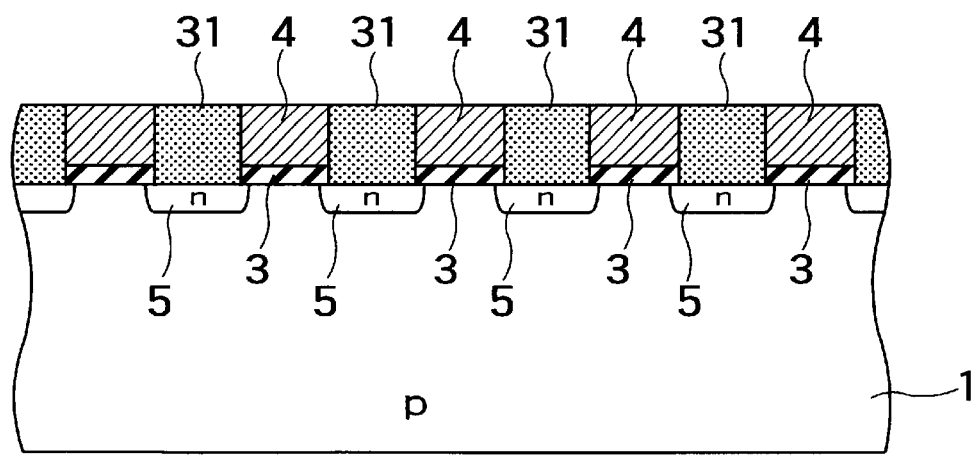
Figure 14A:
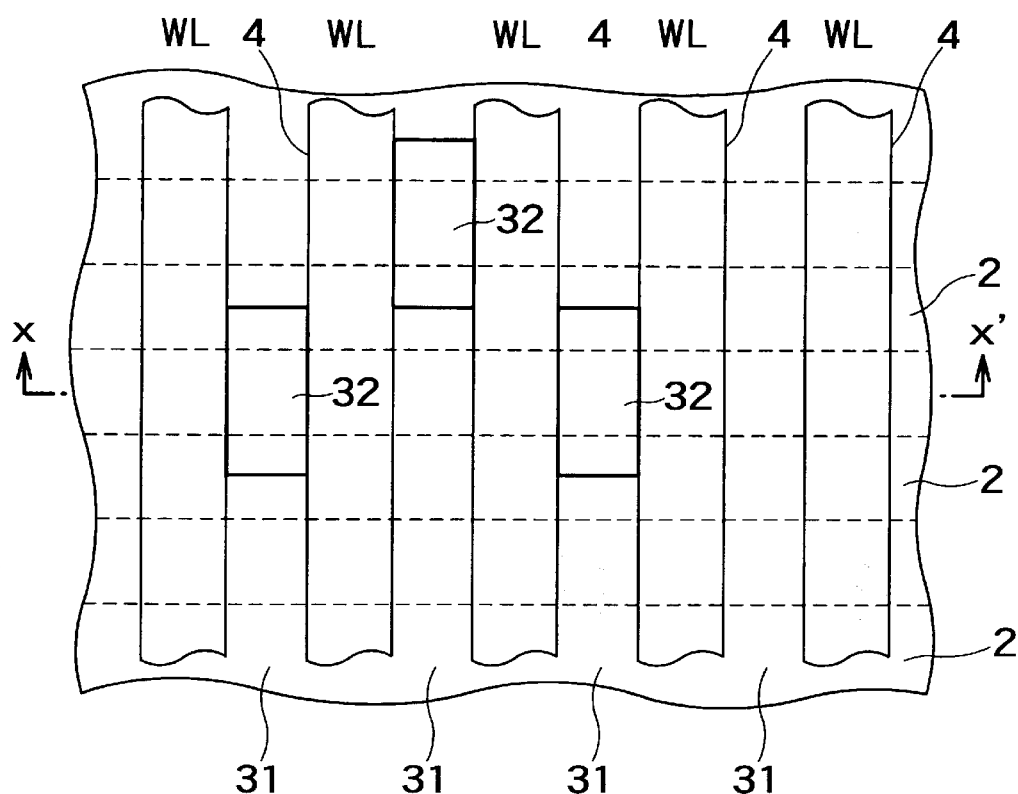
FIGS. 14A and 14B are a plan view and a sectional view showing a state where an opening is formed in the mask material layer in the third embodiment.

An embodiment of a NAND type mask ROM where the oblique ion implanting process is changed will hereinafter be discussed with reference to FIGS. 13 and 14. The components corresponding to those in the preceding first embodiment and 2, are marked with the same reference numerals, of which the repetitive explanations in depth are omitted. FIGS. 13A and 13B are a plan view and a sectional view taken along the line X–X' in FIG. 13A, showing a mask material layer 31 is so formed as to be embedded in between the gate electrodes 4 after arraying the memory transistors.

The mask material layer 31 is, for example, an insulating layer such as a silicon oxide layer. After the memory transistor has been constructed, the mask material layer 31 is deposited over the entire surface thereof and etched back, thereby making it feasible to attain a state where the mask material layers 31 remain embedded in between the gate electrodes 4 and the whole is thus flattened as shown in FIG, 13B.

Figure 14B:
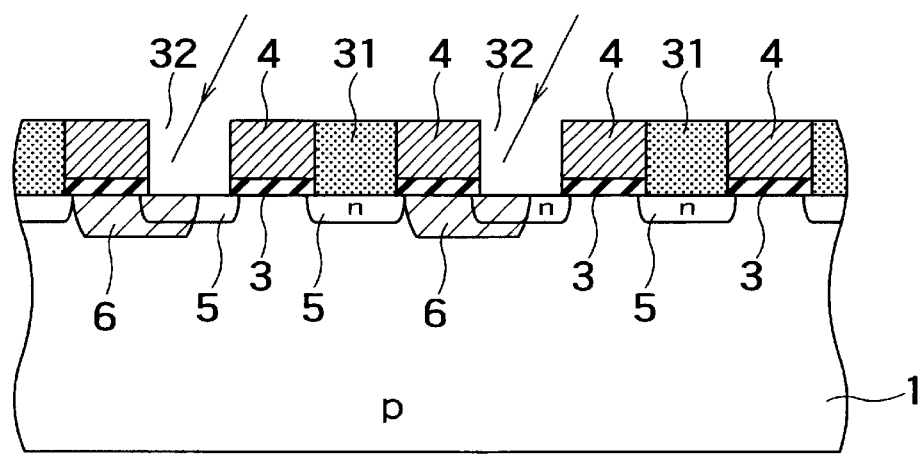

Thereafter, as illustrated in FIG. 14B, an area, above the source diffused layer of the memory transistor on which the channel ion implantation should be effected, of the mask material layer 31 is removed, thus forming an opening 32. In this case, a resist is formed in pattern so as to extend over the adjacent gate electrode 4, and the mask material layer 31 is etched by an etching method exhibiting a large etching selection ratio with respect to the gate electrode 4, in which case the opening 32 completely self-aligned with the gate electrode 4 can be formed. Thereafter, the ion implantation with an inclined angle is carried out in the same way as those in the preceding embodiments, thereby forming the doped channel layer 6 on the selected memory transistor.

Whether the opening 32 should be formed in the mask material layer 31 on the side of the source diffused layer or the drain diffused layer, may be judged based on the criteria in the embodiments 1 and 2. To be more specific, in a case where the memory transistor in the initial state is defined as an E-type NMOS transistor, the opening 32 is formed on the side of the source diffused layer, and an n-type impurity is implanted with an angle, thus setting the transistor in the D-type. In a case where the memory transistor in the initial state is defined as a D-type NMOS transistor, the opening 32 is formed on the side of the drain diffused layer, and a P-type impurity is implanted with an angle, thus setting the transistor in the E-type.

Fourth embodiment

Figure 15:
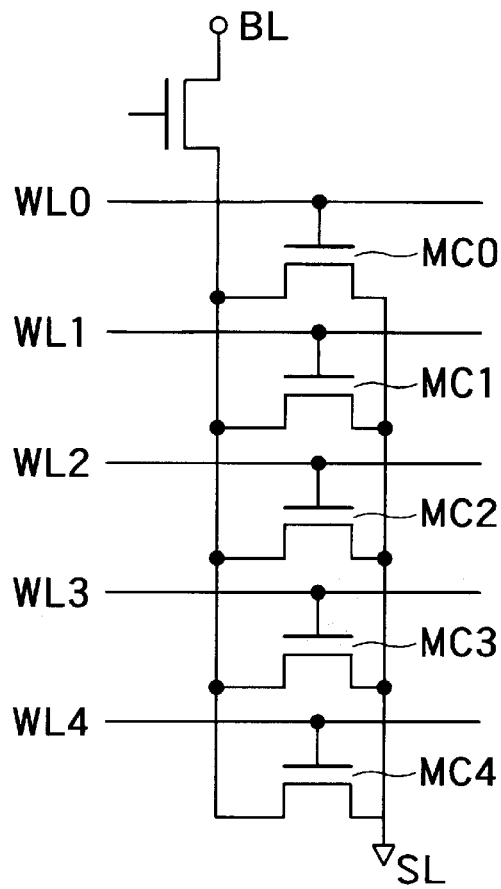
FIG. 15 is a diagram showing an equivalent circuit of the mask ROM in a fourth embodiment of the present invention.
Figure 16:
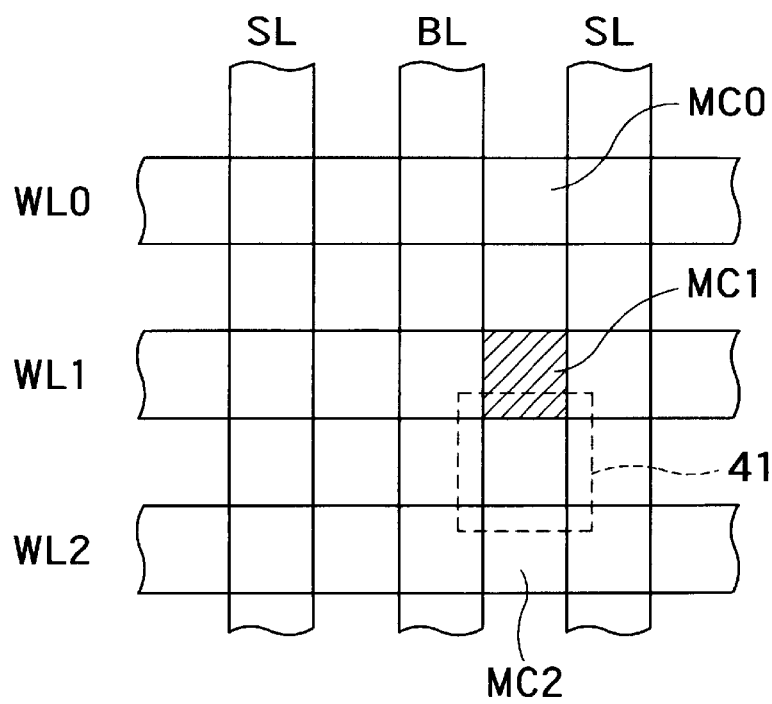
FIG. 16 is an explanatory plan view showing a mask programming process in the fourth embodiment.

A fourth embodiment where the present invention is applied to the mask ROM having an AND-type cell structure will be explained with reference to FIGS. 15 and 16. The AND-type cell structure is, as illustrated in FIG. 15, that a plurality of memory transistors MC are connected in parallel to between the bit lines BL and the source lines SL and respectively selected by individual word lines WL. FIG. 16 shows a layout of the word lines WL, the bit lines BL and the source lines SL.

Though not described in depth, it is the same as the preceding embodiments discussed above that the gate electrodes of memory transistors Mcg are formed in pattern and become the word lines WL. The memory transistors MC0 ~MC4 in the initial state shown in FIG. 15 are classified as the E-type NMOS transistors, and the memory transistor MC1 among those transistors is structured to be selectively the D-type transistor to which data is written. In this case, as illustrated in FIG. 16, there is provided the ion implantation mask including an opening 41 formed on the side of the source diffused layer of the memory transistor MC1. In that case, the substantial opening is, as discussed in the first embodiment, so formed as to be self-aligned with the adjacent word lines WL1, WL2. The ion implantation with an inclined angle is executed by use of the thus constructed mask in the same manner as the preceding embodiments, thereby providing the doped channel layer.

Fifth embodiment

Figure 17:
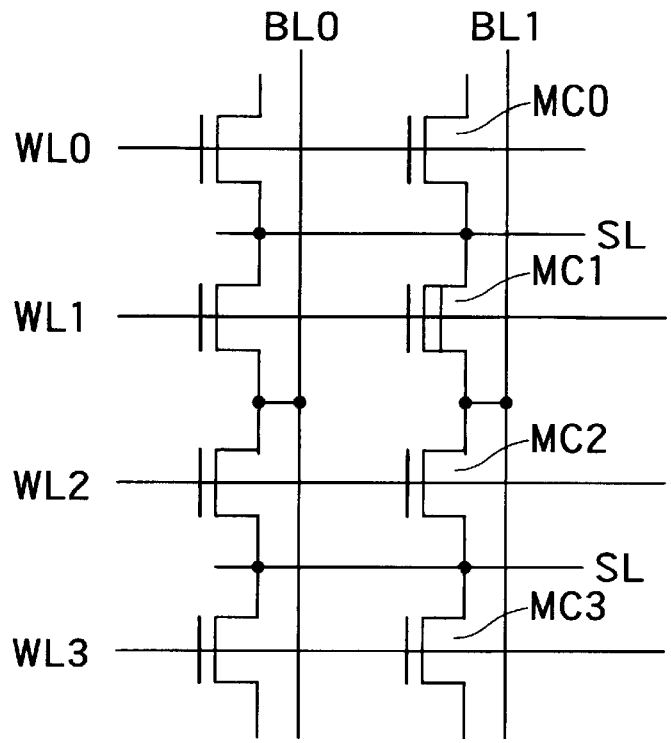
FIG. 17 is a diagram showing an equivalent circuit of the mask ROM in a fifth embodiment of the present invention.
Figure 18:
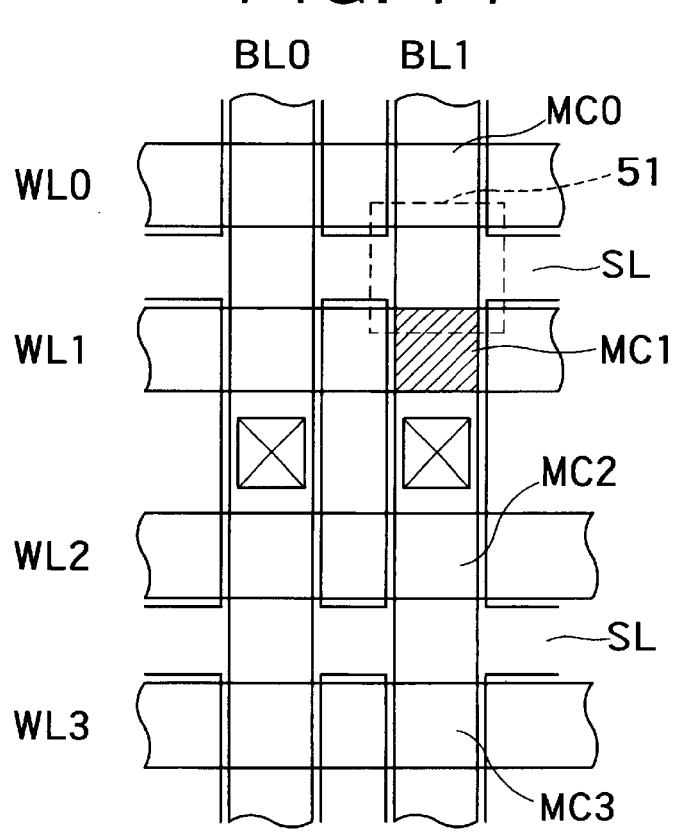
FIG. 18 is an explanatory plan view showing a mask programming process in the fifth embodiment.
Figure 19:
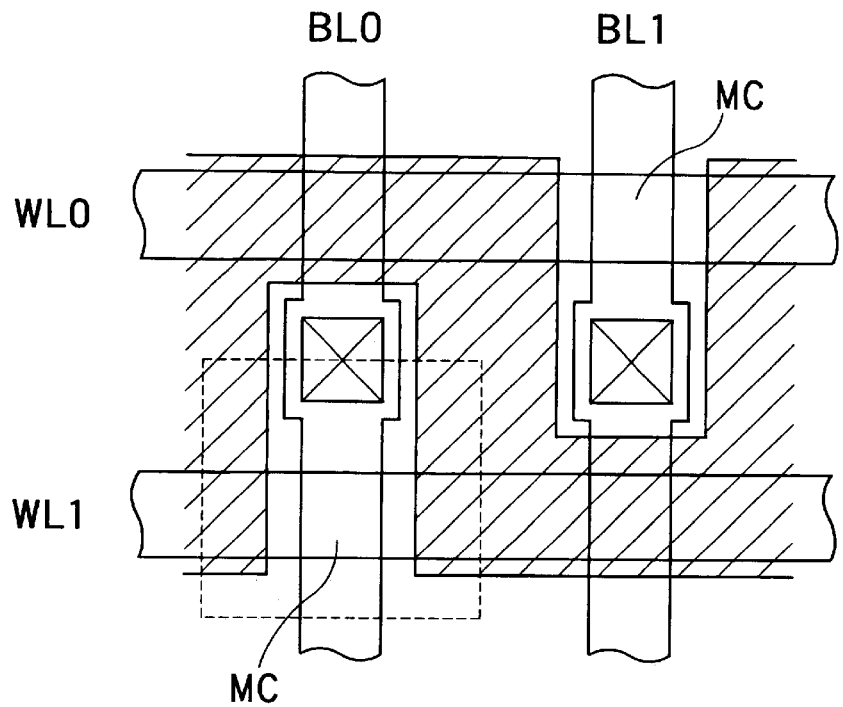
FIG. 19 is an explanatory view showing a diffused layer program mode of a conventional mask ROM.
Figure 20:
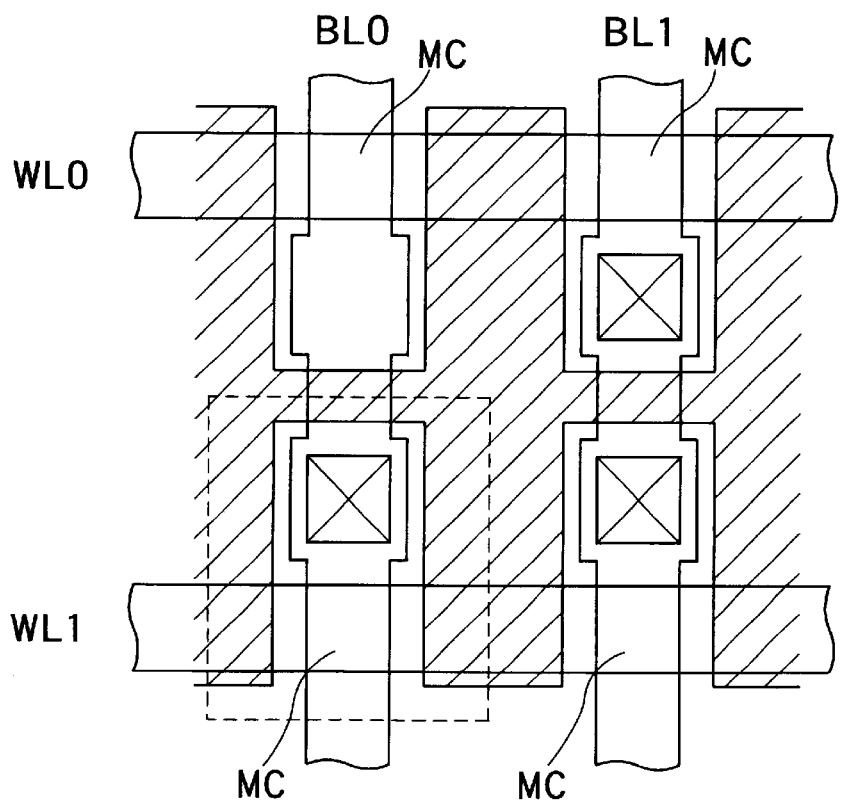
FIG. 20 is an explanatory view showing a contact program mode of the conventional mask ROM.
Figure 21:
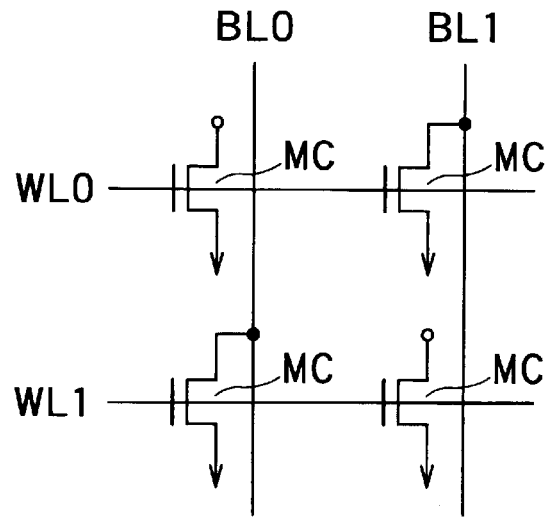
FIG. 21 is a diagram showing an equivalent circuit of a NOR type mask ROM.
Figure 22:
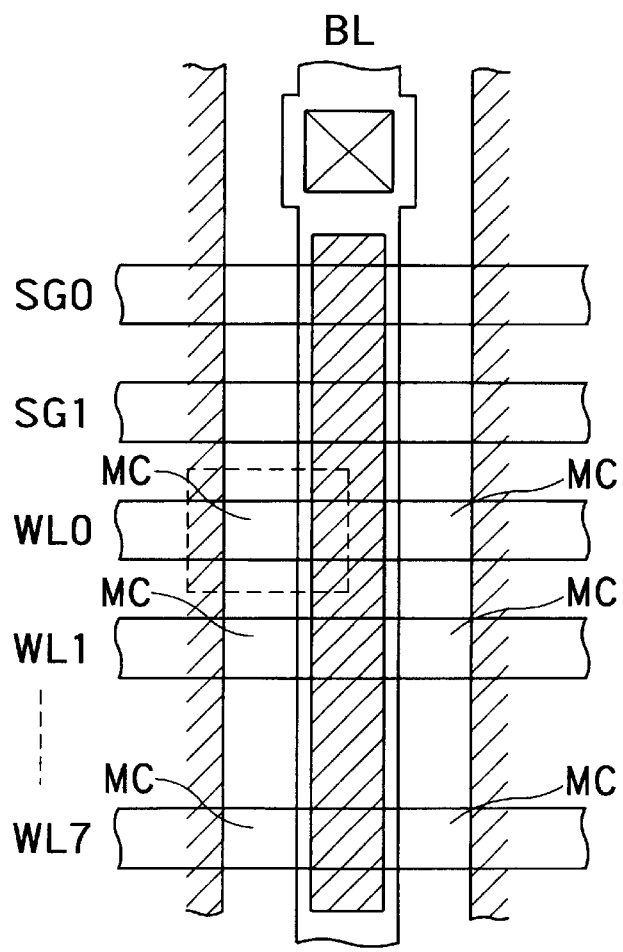
FIG. 22 is a view showing a layout of a conventional NAND type mask ROM.
Figure 23:
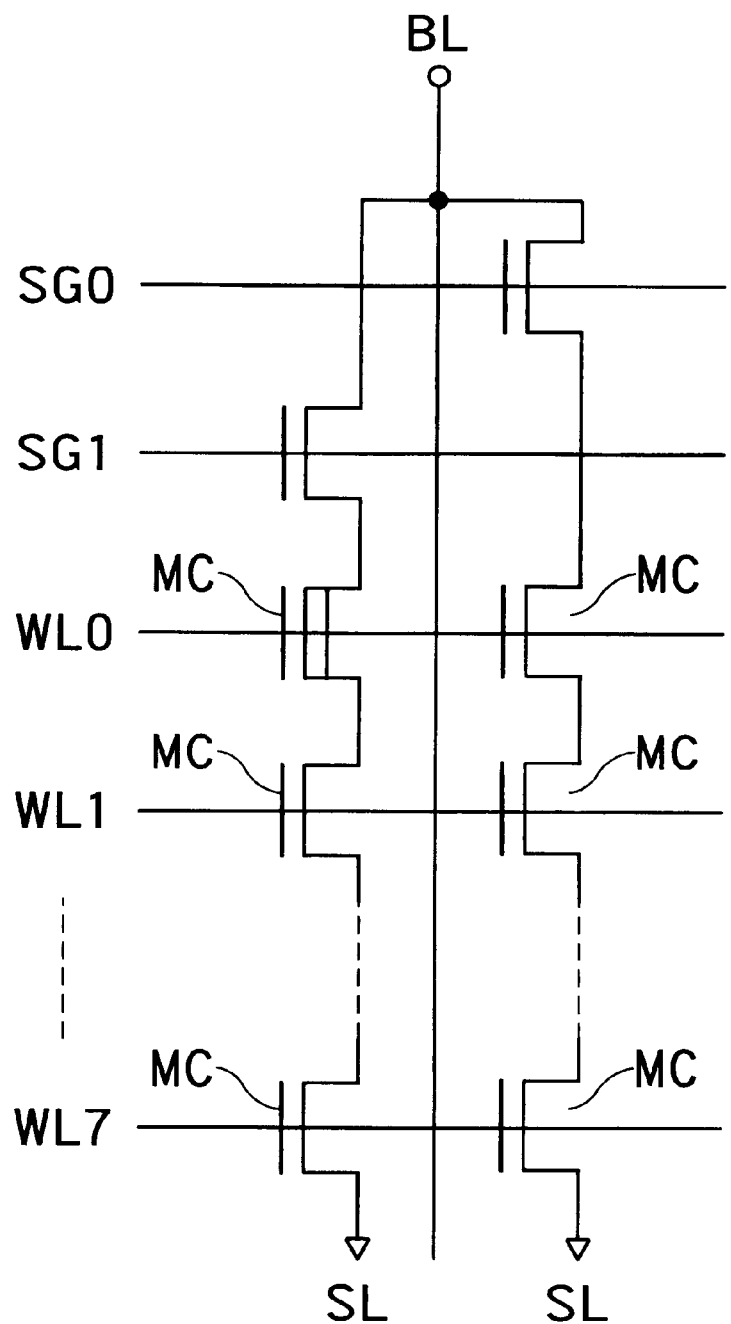
FIG. 23 is a diagram showing an equivalent circuit of the NAND type mask ROM.
Figure 24:
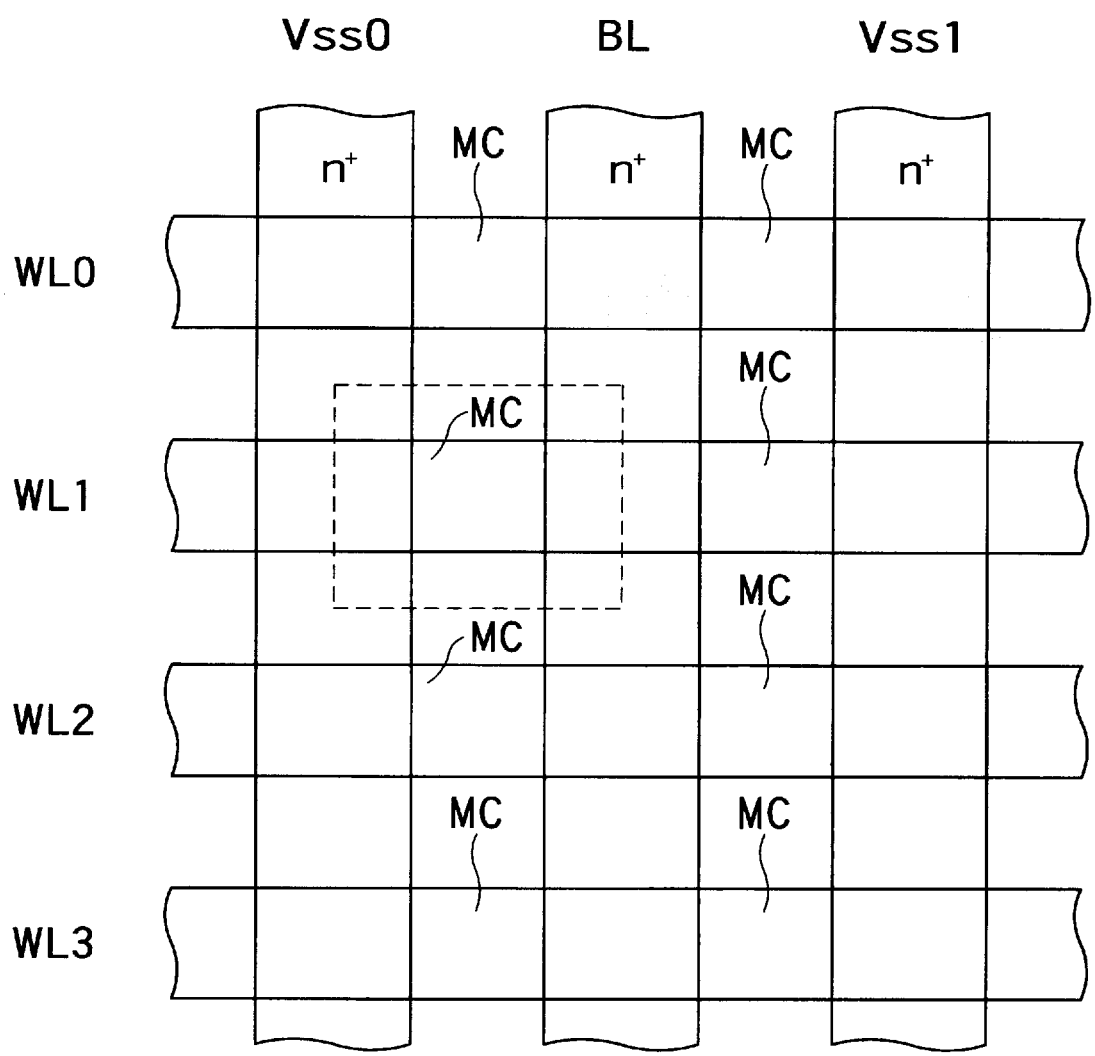
FIG. 24 is a view showing an layout of a conventional contactless type mask ROM cell.

A fifth embodiment where the present invention is applied to the mask ROM having a NOR-type cell structure will be explained with reference to FIGS. 17 and 18. The NOR-type cell structure is also, as illustrated in FIG. 17, such that the plurality of memory transistors MC are connected in parallel to and between the bit lines BL and the source lines SL and respectively selected by the individual word lines WL. FIG. 18 shows a layout of the word lines WL and the bit lines BL. It is assumed that the memory transistor MC0~MC3 in the initial state illustrated in FIG. 17 are the E-type NMOS transistors, and the programming is executed so that the memory transistor MC1 among those transistors is selectively set as the D-type. in that case, as shown in FIG. 18, there is provided the ion implantation mask having an opening 51 formed on the side of the source diffused layer of the memory transistor MC1. The substantial opening is, as already discussed in the first embodiment, self-aligned with the adjacent word lines WL0, WL1. The ion implantation with an inclined angle is executed by use of the thus constructed mask in the same manner as the preceding embodiments, thereby providing the doped channel layer.

The present invention is not limited to the embodiments discussed above. The respective embodiments have dealt with the case where the memory transistor is set in the E- or D-type in the initial state, and in the D- or E-type in the writing state. The initial state and the writing state may, however, be sufficient if having a difference between the threshold voltages to an extent of being distinguishable by the sense amplifier, and both may also be of the E- or D-type.

As discussed above, according to the present invention, the doped channel layer of the memory transistor based on the mask programing is provided in the manner of being self-aligned with the gate electrode by the ion implantation with an inclined angle, whereby the high-integrated mask ROM with the reduced unit cell area can be obtained. Further, according to the present invention, the doped channel layer is overlapped with any one of the source/drain diffused layers and formed deeper than the source/drain diffused layers. The punch-through is thereby prevented.

What is claimed is:

1. A method of manufacturing a semiconductor memory device, comprising the steps of:

forming a plurality of memory transistors, each having a gate electrode with a length being less than or equal to 0.2 μm above a semiconductor substrate, each of said transistors having a source diffused layer and a drain diffused layer;

providing a mask having an opening formed so that a side surface of the gate electrode and a substrate surface of one of the source diffused layer and the drain diffused layer are exposed, wherein an end of the opening of the mask is located on the gate electrode;

implanting impurity ions under the gate electrode and in one of the source and drain diffused layers by implanting impurity ions through said opening with an inclined angle selected from a range from perpendicularity to parallelism to said semiconductor substrate; and diffusing the impurity ions so that a doped channel layer expands to include the whole region under the gate electrode.

2. The method of manufacturing a semiconductor memory device according to claim 1 wherein the step of forming transistors includes a step of forming said gate electrodes of said memory transistors in the same column positions as word lines.

3. The method of manufacturing a semiconductor memory device according to claim 1, wherein said step of providing a mask having an opening includes providing the opening between two adjacent word lines in a self-alignment manner with said word lines.

4. The method of manufacturing a semiconductor memory device according to claim 1, wherein a step of providing said mask includes steps of:

depositing mask material over the whole substrate;

selectively forming an opening at a region located between two adjacent word lines.

5. The method of manufacturing a semiconductor memory device according to claim 4, wherein said step of providing a mask includes the steps of:

embedding a mask material layer in a region between two adjacent word lines, and selectively forming the opening in the embedded mask material layer.

6. The method of manufacturing a semiconductor memory device according to claim 1, wherein an inclined angle θ of the ion implantation to a line perpendicular to said semiconductor substrate is set to satisfy the following relationship:

tan θ<S/H where S is the space between adjacent word lines, and H is the height of the opening.

7. The method of manufacturing a semiconductor memory device according to claim 1, wherein said step of providing a mask is performed so that the opening is provided on a side of the drain diffused layer when initially a D-type memory transistor is changed into an E-type memory transistor and on a side of the source diffused layer when initially an E-type memory transistor is changed into a D-type memory transistor.

8. The method of manufacturing a semiconductor memory device according to claim 1, wherein said gate electrode has a barrier layer thereon.

9. The method of manufacturing a semiconductor memory device according to claim 8, wherein said barrier layer is a metal layer or a polycide layer.

* * * * *